(12) United States Patent
Kurihara et al.

(10) Patent No.: US 6,781,290 B2
(45) Date of Patent: Aug. 24, 2004

(54) PIEZOELECTRIC ACTUATOR, METHOD OF MANUFACTURING THE SAME, INK-JET HEAD USING THE SAME, AND INK-JET PRINTER

(75) Inventors: Kazuaki Kurihara, Kawasaki (JP); Motoyuki Nishizawa, Kawasaki (JP); Masaki Kurasawa, Kawasaki (JP); Keishiro Okamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/259,809

(22) Filed: Sep. 30, 2002

(65) Prior Publication Data

US 2003/0117041 A1 Jun. 26, 2003

Related U.S. Application Data

(63) Continuation of application No. PCT/JP00/02036, filed on Mar. 30, 2000.

(51) Int. Cl.[7] .............................................. H01L 41/08
(52) U.S. Cl. ........................ 310/360; 310/328; 310/331; 310/359
(58) Field of Search ................................ 310/328, 324, 310/358, 359, 360, 361, 313 A, 330–332

(56) References Cited

U.S. PATENT DOCUMENTS

| | | | | |
|---|---|---|---|---|
| 4,965,224 A | * | 10/1990 | Horikawa et al. | 117/95 |
| 5,050,137 A | * | 9/1991 | Sato et al. | 367/150 |
| 5,235,233 A | * | 8/1993 | Yamamoto | 310/313 A |
| 5,567,979 A | | 10/1996 | Nashimoto et al. | |
| 5,631,463 A | * | 5/1997 | Kawasaki et al. | 250/306 |
| 5,739,624 A | * | 4/1998 | Kleiman | 310/328 |
| 5,802,686 A | | 9/1998 | Shimada et al. | |
| 5,933,167 A | | 8/1999 | Shimada et al. | |
| 5,984,458 A | | 11/1999 | Murai | |
| 6,028,020 A | * | 2/2000 | Tanaka et al. | 501/7 |
| 6,140,746 A | * | 10/2000 | Miyashita et al. | 310/358 |
| 6,229,159 B1 | * | 5/2001 | Suzuki | 257/84 |

FOREIGN PATENT DOCUMENTS

| | | |
|---|---|---|
| EP | 0 791 459 A2 | 8/1997 |
| EP | 0 930 165 A1 | 7/1999 |
| JP | 6-196018 | 7/1994 |
| JP | 6-342920 | 12/1994 |
| JP | 9-232644 | 9/1997 |
| JP | 9-254386 | 9/1997 |
| JP | 9-323416 | 12/1997 |
| JP | 10-120494 | 5/1998 |
| JP | 10-286953 | 10/1998 |
| JP | 11-48477 | 2/1999 |
| JP | 11-138809 | 5/1999 |
| JP | 11-179906 | 7/1999 |
| JP | 2000-15809 | 1/2000 |
| JP | 2000-52558 | 2/2000 |

* cited by examiner

*Primary Examiner*—Mark Budd
(74) *Attorney, Agent, or Firm*—Armstrong, Kratz, Quintos, Hanson & Brooks, LLP

(57) ABSTRACT

A piezoelectric actuator includes a single-crystal piezoelectric thin film having a crystal orientation aligned with the crystal orientation of a single-crystal Si substrate, and first and second electrode films formed on first and second sides of the single-crystal piezoelectric thin film, respectively.

54 Claims, 6 Drawing Sheets

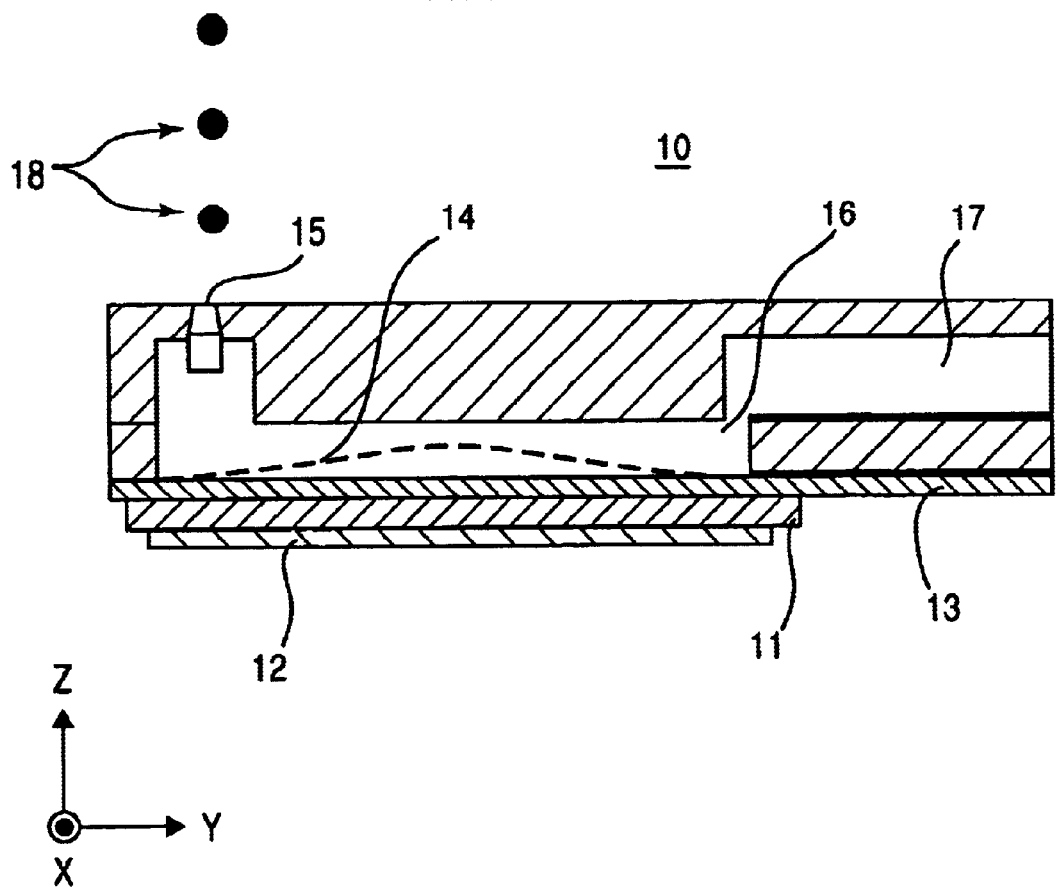

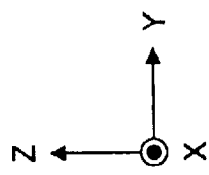
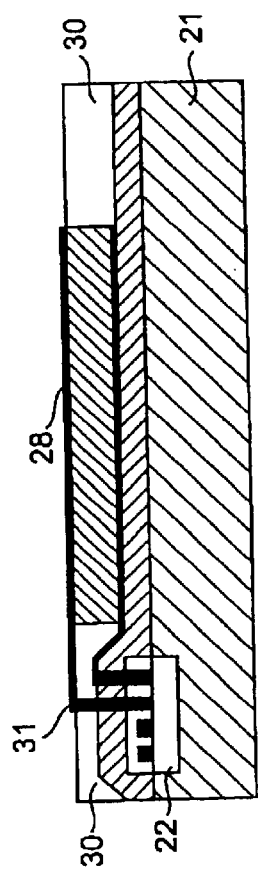
FIG.2F
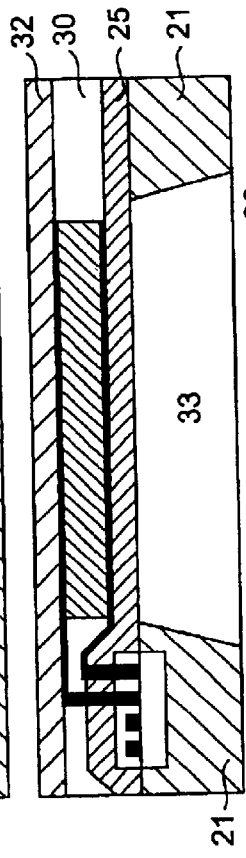
FIG.2G
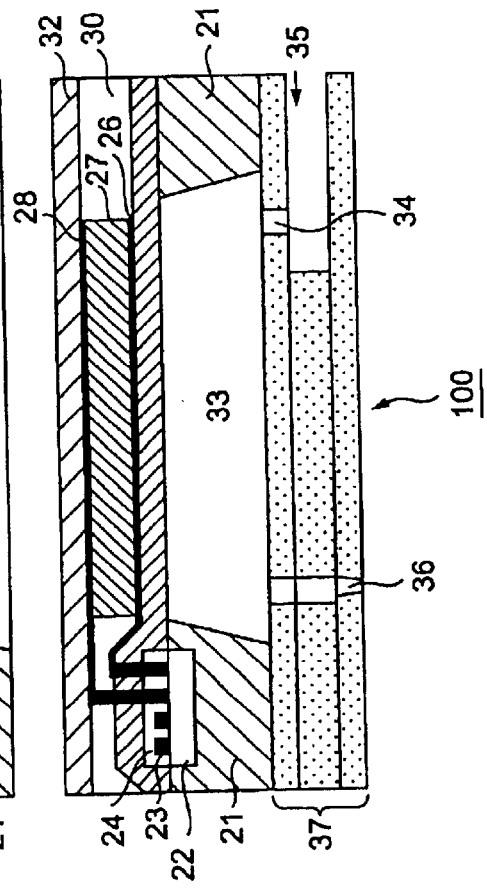
FIG.2H

PIEZOELECTRIC ACTUATOR, METHOD OF MANUFACTURING THE SAME, INK-JET HEAD USING THE SAME, AND INK-JET PRINTER

This application is a continuation of international application PCT/JP00/02036, filed on Mar. 30, 2000.

BACKGROUND OF THE INVENTION

1. Field of the Invention

The present invention relates to piezoelectric actuators, methods of manufacturing the same, ink-jet heads using the same, and ink-jet printers including such ink-jet heads and, more particularly to a piezoelectric actuator applicable to a printer contained in or connected to an electronic apparatus such as a computer, a word processor, a facsimile machine, or a copier, a method of manufacturing such a piezoelectric actuator, an ink-jet head including such a piezoelectric actuator, and an ink-jet printer including such an ink-jet head.

2. Description of the Related Art

Ink-jet heads mounted in printers are categorized into two types: a bubble-jet type and a piezoelectric type. An ink-jet head of the bubble-jet type generates air bubbles by instantaneously heating or vaporizing ink with heating elements and jetting out (spraying) the ink from nozzles by the pressure of the air bubbles. An ink-jet-head of the piezoelectric type jets out ink from nozzles by using the deformation of piezoelectric elements.

The bubble-type ink-jet head has a simple structure such that the ink-driving source (heating element) thereof can be formed by a layering process as in the case of forming a semiconductor device on a substrate. Therefore, the bubble-type ink-jet head has the advantages of high nozzle density and low cost. However, the bubble-type ink-jet head consumes a large amount of power, and has difficulty in performing fine control of ink-jet force to have the disadvantage of relatively poor print quality.

The piezoelectric-type ink-jet head, on the other hand, can perform fine control of ink-jet force so as to be capable of printing with high quality. However, compared with the bubble-type ink-jet head, the piezoelectric-type ink-jet head has a complicated structure and is inferior in terms of nozzle density and cost. Therefore, recently, a piezoelectric-type ink-jet head using a unimorph actuator formed by forming a thin film of a piezoelectric element has been proposed in order to downsize the piezoelectric-type ink-jet head and increase the nozzle density thereof.

FIG. 1 is a sectional view of an ink-jet head 10 using such unimorph actuators, showing the outline of the configuration of the ink-jet head 10. In FIG. 1, the ink-jet head 10 includes an ink supply system including ink pressure chambers 14, a pressure generation system including piezoelectric thin films 11 as piezoelectric elements generating pressure inside the ink pressure chambers 14, and nozzles 15 spraying ink particles 18 in accordance with the pressure generated inside the ink pressure chambers 14. The ink supply system is composed of a common ink channel 17 supplying ink from an ink tank (not shown in the drawing) and ink supply openings 16 connecting the common ink channel 17 to the ink pressure chambers 14.

The pressure generation system is composed of a diaphragm 13 forming one of the sidewalls of each ink pressure chamber 14, the piezoelectric thin films 11 provided thereon (thereunder in FIG. 1), and individual electrodes 12 provided on the piezoelectric thin films 11. The diaphragm 13, which is formed of, for instance, a chromium (Cr)-based conductive material, also serves as a common electrode. The diaphragm 13 is provided to cover all of the ink pressure chambers 14 provided independently along the X-axis of FIG. 1.

The piezoelectric thin films 11 and the individual electrodes 12 are provided individually for the corresponding ink pressure chambers 14. When the piezoelectric thin films 11 are supplied with electric charges between the individual electrodes 12 and the diaphragm 13, each of the piezoelectric thin films 11 deforms in proportion to the supplied amount of electric charge. The diaphragm 13 is bent as indicated by the broken line in FIG. 1 by the deformation of the piezoelectric thin films 11 so as to cause pressure inside the ink pressure chambers 14. Thereby, the ink particles 18 are jetted out from the nozzles 15 so that recording such as printing is performed on a recording medium.

As is apparent from the above description, the piezoelectric thin films 11, the individual electrodes 12, and the diaphragm 13 serve as actuators generating energy for ink ejection. If each actuator part is formed to have higher sensitivity and more durability, the performance of the ink-jet head can be improved.

Therefore, there has been proposed an ink-jet head using high-performance actuators that increase piezoelectric performance and resistance to pressure and stress by using single-crystal thin films as the piezoelectric thin films 11, thereby generating a large amount of deformation and force with a low voltage. In order to obtain the single-crystal piezoelectric thin films, however, it is required to use an expensive MgO or STO ($SrTiO_3$) single-crystal substrate on which to form single-crystal piezoelectric thin films. Further, it is difficult to grow the MgO single crystal over a large area, thus causing the problem of an increase in the production cost.

SUMMARY OF THE INVENTION

Accordingly, it is a general object of the present invention to provide a piezoelectric actuator in which the above-described disadvantages are eliminated, a method of manufacturing such a piezoelectric actuator, an ink-jet head using such a piezoelectric actuator, and an ink-jet printer using such an ink-jet head.

A more specific object of the present invention is to provide a piezoelectric actuator including a piezoelectric thin film having high piezoelectric performance and excellent resistance to pressure and stress, a method of manufacturing such a piezoelectric actuator, an ink-jet head realizing high nozzle density and reduction in size and cost by using such a piezoelectric actuator, and an ink-jet printer using such an ink-jet head.

The above objects of the present invention are achieved by a piezoelectric actuator including a single-crystal piezoelectric thin film having a crystal orientation thereof aligned with a crystal orientation of a single-crystal Si substrate, and first and second electrode films formed on first and second sides of the single-crystal piezoelectric thin film, respectively.

The above objects of the present invention are also achieved by a piezoelectric actuator including a plurality of single-crystal piezoelectric thin films each having a crystal orientation thereof aligned with a crystal orientation of a single-crystal Si substrate, and a plurality of electrode films, wherein the single-crystal piezoelectric thin films and the electrode films are alternately layered one over another in contact with each other in a hetero-epitaxial relationship.

Compared with the conventional polycrystal piezoelectric thin film, the single-crystal piezoelectric thin film has better piezoelectric performance and resistance to pressure and stress, thus making it possible to perform finer processing on the ink-jet head.

The above objects of the present invention are also achieved by an ink-jet head including a piezoelectric actuator that includes a single-crystal piezoelectric thin film having a crystal orientation thereof aligned with a crystal orientation of a single-crystal Si substrate, and first and second electrode films formed on first and second sides of the single-crystal piezoelectric thin film, respectively.

The above objects of the present invention are also achieved by an ink-jet head including a piezoelectric actuator that includes a plurality of single-crystal piezoelectric thin films each having a crystal orientation thereof aligned with a crystal orientation of a single-crystal Si substrate, and a plurality of electrode films, wherein the single-crystal piezoelectric thin films and the electrode films are alternately layered one over another in contact with each other in a hetero-epitaxial relationship.

The piezoelectric actuators of the present invention are applied to the above-described ink-jet heads as drive sources for ejecting ink particles. Therefore, the above-described ink-jet heads realize high nozzle density, reduction in size and cost, and fine dot formation.

The above objects of the present invention are also achieved by an ink-jet printer including an ink-jet head that includes a piezoelectric actuator, the piezoelectric actuator including a single-crystal piezoelectric thin film having a crystal orientation thereof aligned with a crystal orientation of a single-crystal Si substrate, and first and second electrode films formed on first and second sides of said single-crystal piezoelectric thin film, respectively.

The above objects of the present invention are also achieved by an ink-jet printer including an ink-jet head that includes a piezoelectric actuator, the piezoelectric actuator including a plurality of single-crystal piezoelectric thin films each having a crystal orientation thereof aligned with a crystal orientation of a single-crystal Si substrate, and a plurality of electrode films, wherein the single-crystal piezoelectric thin films and the electrode films are alternately layered one over another in contact with each other in a hetero-epitaxial relationship.

The above-described ink-jet printers include the ink-jet heads of the present invention. Therefore, the above-described ink-jet printers are reduced in size and provide high image quality.

The above objects of the present invention are further achieved by a method of manufacturing a piezoelectric actuator, the method including the steps of (a) preparing a single-crystal Si substrate, growing an intermediate film hetero-epitaxially on a surface of the single-crystal Si substrate, and growing a piezoelectric thin film hetero-epitaxially on the intermediate film, and (b) removing part of the single-crystal Si substrate, the part corresponding to a region driven by the piezoelectric thin film.

The piezoelectric actuators of the present invention are manufactured by the above-described method.

BRIEF DESCRIPTION OF THE DRAWINGS

Other objects, features and advantages of the present invention will become more apparent from the following detailed description when read in conjunction with the accompanying drawings, in which:

FIG. 1 is a sectional view of a conventional ink-jet head using unimorph actuators, showing the outline of the configuration of the ink-jet head;

FIGS. 2A through 2H are diagrams for illustrating, step by step, a process for manufacturing an ink-jet head according to a first embodiment of the present invention;

DETAILED DESCRIPTION OF THE PREFERRED EMBODIMENTS

Figure 2A:
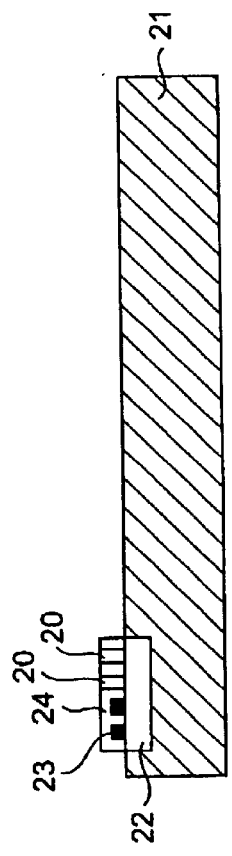

A description will now be given, with reference to the accompanying drawings, of embodiments of the present invention.

In the present invention, a conventional MgO substrate that is widely used in this technical field is not employed, but a single-crystal silicon (Si) wafer that is used in the field of semiconductor manufacture is employed. Compared with the MgO substrate, the single-crystal Si wafer is inexpensive and can be formed to have a large area, thereby realizing cost reduction.

Further, in the present invention, a perovskite oxide such as PZT ($PbZrO_3$), which is widely used, is employed as a piezoelectric material.

Single-crystal Si and perovskite oxide are different in crystal structure and lattice constant. Therefore, simply forming the perovskite oxide on the single-crystal Si results in a polycrystal structure. The inventors of the present invention have confirmed, through their intensive studies, that a single-crystal perovskite oxide, which has been considered difficult to form, can be obtained by forming an intermediate film of a given structure on the single-crystal Si and forming a perovskite oxide film on the-intermediate film.

The intermediate film has the function of achieving lattice consistency between the single-crystal Si and the perovskite oxide. Each of oxides such as $Y_2O_3$-added $ZrO_2$ (YSZ), $MgAlO_3$ (MAS), CeO, MgO, and $Al_2O_3$ can be recommended as a material suitable for the intermediate film.

That is, any of the above-described oxides is grown hetero-epitaxially on the single-crystal Si to be formed into the intermediate film, and the perovskite oxide is grown hetero-epitaxially on the intermediate film to be formed into a single-crystal piezoelectric thin film. The single-crystal piezoelectric thin film then has its crystal orientation aligned with that of the single-crystal Si. The single-crystal piezoelectric thin film may have its crystal orientation substantially aligned with that of the single-crystal Si based on the intermediate film. Therefore, the single-crystal piezoelectric thin film may contact the intermediate film indirectly through an electrode film. In such a case, the single-crystal Si, the intermediate film, the electrode film, and the single-crystal piezoelectric thin film are formed in the order described so that films contacting each other have a hetero-epitaxial relationship.

Among the above-described oxides, YSZ is preferable as a material for the intermediate film since YSZ is excellent in chemical stability, mechanical strength, and insulating properties, and a highly crystalline hetero-epitaxial film having good quality can be obtained therefrom.

The crystal lattice constants of single-crystal Si and the oxides used as material for the intermediate film are shown below in Table 1 for reference. The comparison is based on the length of one side of a crystal lattice since the materials shown below are of the cubic system.

TABLE 1

Comparison of lattice constants

| Material | Lattice Constants (nm) |
| --- | --- |
| Si | 0.543 |
| YSZ | 0.514 |
| $MgAlO_3$ | 0.808 |
| CeO | 0.541 |
| MgO | 0.421 |
| $Al_2O_3$ | 0.476 |

A piezoelectric actuator having high sensitivity and resistance can be formed by forming, by a thin film deposition process, an electrode film for supplying an electric charge on each face of the single-crystal piezoelectric thin film formed of the perovskite oxide as described above.

Next, a description will be given of three example methods of manufacturing an ink-jet head including such a piezoelectric actuator.

In the first manufacturing method, first, the <100> plane of the intermediate film of YSZ and the <100> plane of a lower electrode film of Pt are successively grown hetero-epitaxially on a substrate having a <100> single-crystal Si plane. By hetero-epitaxially growing PZT, for instance, on the <100> plane of the lower Pt electrode film as a piezoelectric thin film, a PZT single crystal of c-axis orientation, which is the same crystal orientation as that of the single crystal Si, is obtained. Thereafter, a film of, for instance, chromium (Cr) is formed on the PZT single crystal as a diaphragm, so that a lamination having the configuration of a piezoelectric actuator is completed.

Thereafter, ink pressure chambers and nozzles are formed on the laminations, the Si substrate and the YSZ intermediate film are partially removed from the lower side, and patterning is performed on the lower Pt electrode film and the YSZ intermediate film. Thereby, an ink-jet head is completed.

In the second manufacturing method, first, the <100> plane of the intermediate film of MAS and the <100> plane of a lower electrode film of Pt are successively formed hetero-epitaxially on a substrate having a <100> single-crystal Si plane. By hetero-epitaxially growing PZT, for instance, on the <100> plane of the lower Pt electrode film as a piezoelectric thin film, a PZT single crystal of c-axis orientation, which is the same crystal orientation as that of the single crystal Si, is obtained. Next, the parts of the PZT single crystal and the lower Pt electrode film other than those for drive regions are removed, and planarization is performed on a resultant structure by applying polyimide thereon. Thereafter, a film of, for instance, TiN is formed as a common electrode serving also as a diaphragm. Thereby, a lamination having the configuration of a piezoelectric actuator is completed.

Thereafter, ink pressure chambers and nozzles are formed on the laminations, the single-crystal Si substrate and the MAS intermediate film are partially removed, and patterning is performed on the lower Pt electrode film and the MAS intermediate film from the lower side. Thereby, an ink-jet head is completed.

A description will be given of the third manufacturing method. In the third manufacturing method, YSZ is used for the intermediate film, which film is also used as a diaphragm. First, the <100> plane of the intermediate film of YSZ and the <100> plane of a lower electrode film of Pt are successively grown hetero-epitaxially on a substrate having a <100> single-crystal Si plane. By hetero-epitaxially growing PZT, for instance, on the <100> plane of the lower Pt electrode film as a piezoelectric thin film, a PZT single crystal of c-axis orientation, which is the same crystal orientation as that of the single crystal Si, is obtained. Thereafter, an upper electrode film of Pt is formed on the PZT single crystal, and patterning is performed on the upper Pt electrode film and the PZT single crystal so as to form drive parts.

Thereafter, the single-crystal Si substrate is partially removed from the lower side so that ink pressure chambers are formed to correspond to the PZT drive parts, and an ink channel and nozzles are further formed. Thereby, an ink-jet head is completed.

Further cost reduction can be achieved by preforming a drive circuit for driving the piezoelectric thin film unitarily with the single-crystal Si wafer used in each of the above-described manufacturing methods.

Further, the piezoelectric thin film of, the above-described piezoelectric actuators is basically of a unimorph type formed of a single layer, but may be of a bimorph type or of a multimorph type formed of three layers or more. In such a multilayer (piezoelectric and electrode) film structure, films contacting each other have a hetero-epitaxial relationship.

A material having a large piezoelectric constant, a large elastic modulus, and high mechanical strength, such as a lead-based perovskite oxide, is suitable for the piezoelectric thin film. Of widely used perovskite oxides such as PZT (PbZrO3), PLZT, and PMN-PT, PZT is recommended.

Further, the diaphragm is required to have high elasticity and high breaking strength, while it does not matter whether the diaphragm is an insulator or a conductor. In the case of forming the diaphragm of a conductive material, the diaphragm may be used also as a common electrode. Further, in the case of using the piezoelectric actuator of the present invention in an ink-jet head as described above, the diaphragm is preferably formed of a material having chemical stability with respect to ink.

Next, a description will be specifically given, with reference to FIGS. 2A through 5, of manufacturing processes of an ink-jet head.

[First Embodiment]

FIGS. 2A through 2H are diagrams showing, step by step, a process for manufacturing an ink-jet head 100 using $Y_2O_3$-added $ZrO_2$ (YSZ) for the intermediate film, which film is also used as the diaphragm.

FIGS. 2A through 2H show a side of only one of the devices of the ink-jet head 100 which devices are formed on a single-crystal Si wafer 21 used as a substrate. According to this embodiment, the devices each having the same configuration as shown in FIGS. 2A through 2H are successively formed on the single-crystal Si wafer 21 along the X-axis and the Y-axis of FIGS. 2A through 2H. However, the following description is focused only on the one of the devices for the purpose of simplification.

FIG. 2A is a diagram showing the step of preparing interconnection lines for driving a piezoelectric actuator as a drive part on the single-crystal Si wafer 21. A semiconductor circuit 22 such as a piezoelectric actuator driving circuit and interconnection lines 23 are provided beforehand on the single-crystal Si wafer 21. The surfaces of the semiconductor circuit 22 and the interconnection lines 23 are protected by a SiON passivation film 24. Via holes 20 for extending interconnection lines are formed in the passivation film 24 by reactive ion etching (RIE).

In this embodiment, the number of devices formed on the single-crystal Si wafer 21 is increased because the Si wafer (substrate) 21 has a larger area than the conventional MgO substrate.

Figure 2B:
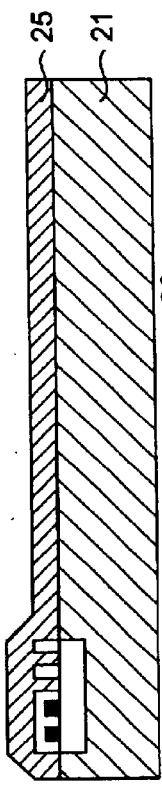

FIG. 2B shows the step of forming a YSZ intermediate film 25 on the single-crystal Si wafer 21. The YSZ intermediate film 25 is hetero-epitaxially grown on the single-crystal Si wafer 21 by sputtering.

Figure 2C:
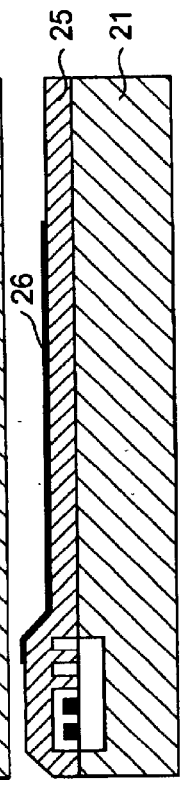

FIG. 2C shows the step of forming a lower electrode (film) 26. A Pt film is hetero-epitaxially grown on the YSZ intermediate film 25 as the lower electrode 26 by sputtering. The unnecessary parts of the Pt film are removed by ion milling.

Figure 2D:
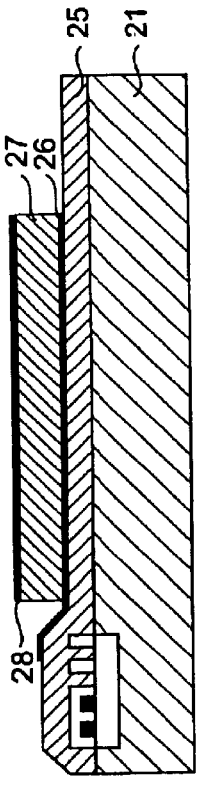

FIG. 2D shows the step of forming a single-crystal piezoelectric thin film 27. The single-crystal piezoelectric thin film 27 using PZT as a piezoelectric material and an upper Pt electrode (film) 28 are successively grown heteroepitaxially on the lower Pt electrode 26 by sputtering. The unnecessary parts of the single-crystal piezoelectric thin film 27 and the upper Pt electrode 28 are removed by RIE so as to preserve a region where the piezoelectric actuator is to be formed.

Figure 2E:
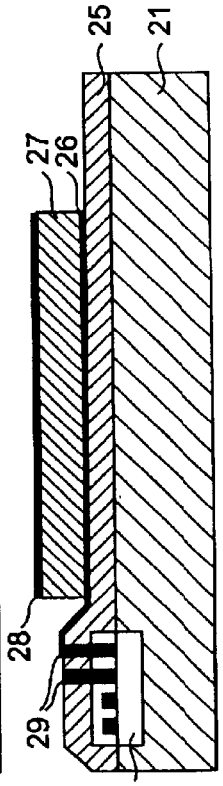

FIG. 2E shows the step of connecting the lower Pt electrode 26 and an interconnection line of the semiconductor circuit 22. Via holes are formed in the YSZ intermediate film 25 by RIE. Then, the via holes are filled with aluminum (Al) 29 by sputtering, and a given wiring pattern is formed by RIE.

FIG. 2F shows the step of connecting the upper Pt electrode 28 and an interconnection line of the semiconductor circuit 22. After coating the upper surface of the structure of FIG. 2E with a polyimide layer 30, the surface of the polyimide layer 30 is polished to be planarized. Then, a via hole for connection with the upper Pt electrode 28 is formed in the polyimide layer 30. Thereafter, the via hole is filled with aluminum (Al) 31 by sputtering, and a given wiring pattern is formed by RIE.

FIG. 2G shows the step of protecting the upper surface of the structure of FIG. 2F and forming a pressure chamber 33 driven by the piezoelectric actuator. After coating the upper surface of the structure of FIG. 2F with a polyimide layer, the surface of the polyimide layer is polished to be planarized so that the polyimide layer is formed into a polyimide passivation film 32.

On the other hand, anisotropic etching is performed on the structure of FIG. 2F from its lower side so as to remove the part of the single-crystal Si wafer 21 which part corresponds to a region driven by the piezoelectric actuator, thereby forming the pressure chamber 33.

FIG. 2H shows the completed ink-jet head 100. The ink-jet head 100 is formed by attaching an upper half body, which is the structure formed through the steps shown in FIGS. 2A through 2G, to a separately prepared lower half body 37 including ink supply openings 34, an ink channel 35, and nozzle holes 36, although only one of the ink supply openings 34 and only one of the nozzle holes 36 are shown in FIG. 2H.

Figure 3:
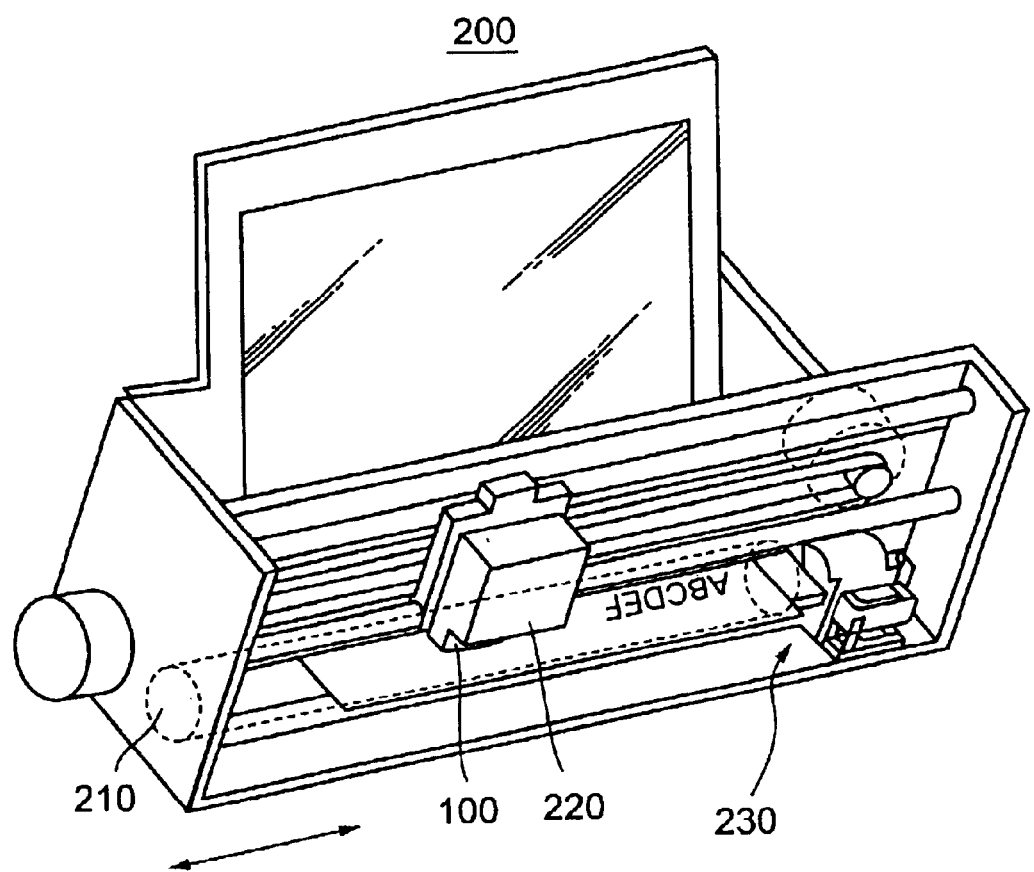
FIG. 3 is a diagram showing an ink-jet printer to which the ink-jet head of the first embodiment of the present invention is applied.
Figure 4:
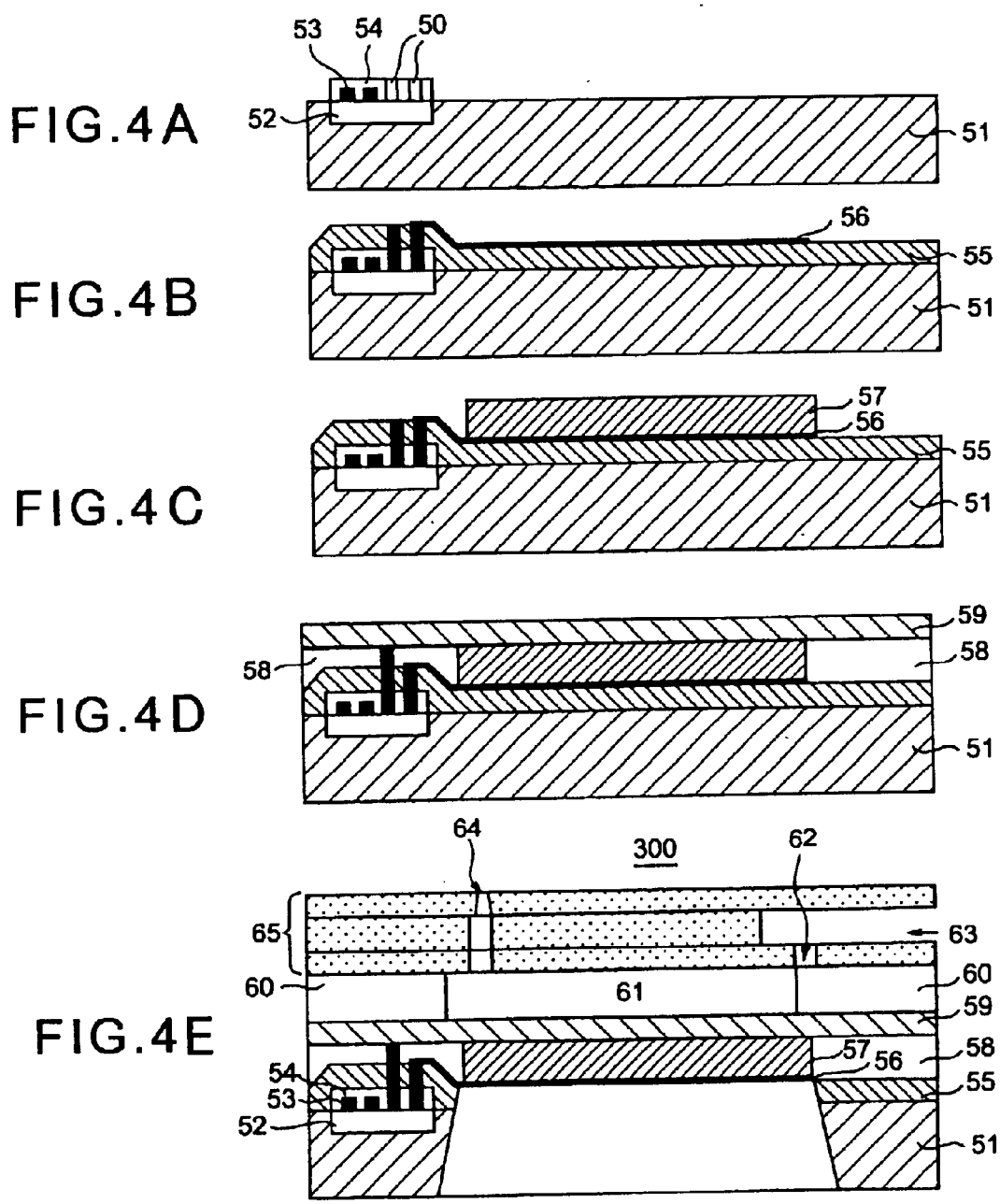
FIGS. 4A through 4E are diagrams for illustrating, step by step, a process for manufacturing an ink-jet head according to a second embodiment of the present invention.

The above-described ink jet head 100 can be employed as the ink head part of an ink-jet printer 200 including a paper feed mechanism 210, an ink tank 220, and a head cleaning and purge mechanism 230 as shown in FIG. 3, realizing high quality imaging. The ink head part moves in the directions indicated by the arrow in FIG. 3.

The inventors of the present invention conducted tests to compare the characteristics of conventionally used polycrystal PZT and single-crystal PZT employed in the present invention with each of polycrystal PZT and single-crystal PZT being formed on a Si wafer, and have obtained the following results shown in Table 2.

TABLE 2

Comparison of characteristics of polycrystal PZT and single-crystal PZT each formed on Si wafer

| Crystal type | Piezoelectric constant d31 (pm/V) | Resistance to pressure (kV/mm) | Resistance to stress (Mpa) |
| --- | --- | --- | --- |
| Polycrystal (conventional) | 55 | 15 | 200 |
| Single crystal (present invention) | 100 | 50 | 900 |

As is apparent from Table 2, single-crystal PZT is superior to polycrystal PZT in each of piezoelectric constant, resistance to pressure, and resistance to stress. These results show that a piezoelectric actuator having such a single-crystal thin film has high sensitivity and durability.

Further, the inventors of the present invention compared the ink-jet head 100 manufactured in the first embodiment with an ink-jet head manufactured to have an actuator part including a polycrystal piezoelectric thin film.

[First Comparison]

Print tests were conducted using the ink-jet head 100 of the first embodiment and an ink-jet head for comparison having the same basic structure as the ink-jet head 100 but using a polycrystal YSZ diaphragm and a polycrystal PZT thin film. The polycrystal piezoelectric thin film of the ink-jet head for comparison was short-circuited and damaged with one third of the maximum voltage applied to the ink-jet head 100 of the first embodiment. Further, when the ink-jet head for comparison was driven by voltages reduced so as not to cause a short circuit, the ink-jet head for comparison jetted out only insufficient ink particles, thus resulting in poor print performance.

As is apparent from the above description; the ink-jet head 100, whose drive part is the piezoelectric actuator including the PZT single-crystal thin film having high sensitivity and good durability, can be reduced in size with high nozzle density and realize high-quality and high-speed printing. Further, since the ink-jet head, 100 employs a Si wafer, which has a larger area than the conventional substrate, the ink-jet head 100 can be manufactured at considerably reduced cost.

[Second Embodiment]

Next, a description will be given, with reference to FIGS. 4A through 4E, of the second embodiment of the present invention. In an ink-jet head 300 of the second embodiment, MgAlO$_3$ (MAS) is used for the intermediate film, and a diaphragm is formed of Cr to serve also as an upper electrode.

For the purpose of simplification, as in the first embodiment, the following description is focused on only one of the devices of the ink-jet head 300, which devices each have the same configuration as shown in FIGS. 4A through 4E and are successively formed on a single-crystal Si wafer 51 used as a substrate along the X-axis and the Y-axis of FIGS. 4A through 4E.

FIG. 4A shows the step of preparing interconnection lines for driving a piezoelectric actuator on the single-crystal Si wafer 51. A semiconductor circuit 52 such as a piezoelectric actuator driving circuit and interconnection lines 53 are provided beforehand on the single-crystal Si wafer 51. The surfaces of the semiconductor circuit 52 and the interconnection lines 53 are protected by a SiON passivation film 54. Via holes 50 for extending interconnection lines are formed in the passivation film 54 by RIE.

FIG. 4B shows the step of forming an MAS intermediate film 55 on the single-crystal Si wafer 51 and forming a lower electrode (film) 56 on the MAS intermediate film 55. The MAS intermediate film 55 is grown hetero-epitaxially on the single-crystal Si wafer 51 by sputtering. After forming via holes for interconnection in the MAS intermediate film 55 by RIE, a Pt film is grown hetero-epitaxially on the MAS intermediate film 55 as the lower electrode 56 by sputtering. Thereafter, the unnecessary parts of the Pt film are removed by ion milling.

FIG. 4C shows the step of forming a single-crystal piezoelectric thin film 57. Using PZT as a piezoelectric material, the PZT piezoelectric thin film 57 is grown hetero-epitaxially on the lower Pt electrode 56 by chemical solution deposition (CSD). The unnecessary parts of the PZT piezoelectric thin film 57 are removed by RIE to preserve a region where the piezoelectric actuator is to be formed.

FIG. 4D shows the step of forming the diaphragm. After coating the upper surface of the structure of FIG. 4C with a polyimide layer 58, the surface of the polyimide layer 58 is polished to be planarized. Then, a via hole for an upper electrode is formed in the polyimide layer 58 by RIE. Thereafter, a Cr film 59 serving as the diaphragm and the upper electrode is grown hetero-epitaxially on the polyimide layer 58 by sputtering.

FIG. 4E shows the completed ink-jet head 300. A polyimide film 60 is formed on the structure of FIG. 4D and is subjected to etching by RIE so that a pressure chamber 61 is formed therein. Thereby, the lower half body of the ink-jet head 300 is formed. Further, an upper half body 65 including ink supply openings 62, an ink channel 63, and nozzles 64 is separately prepared to be attached to the lower half body. In FIG. 4E, only one of the ink supply openings 62 and only one of the nozzles 64 are shown. Finally, the parts of the single-crystal Si wafer 51 and the MAS intermediate film 55 which parts correspond to a region driven by the piezoelectric actuator are removed by etching, so that the ink-jet head 300 is completed.

Like the ink-jet head 100 of the first embodiment, the ink-jet head 300 manufactured according to the second embodiment has high sensitivity and good durability and realizes high-quality and high-speed printing.

The ink-jet head 300 of the second embodiment was also compared with an ink-jet head manufactured with a polycrystal piezoelectric thin film.

[Second Comparison]

Print tests were conducted using the ink-jet head 300 of the second embodiment and an ink-jet head for comparison having the same basic structure as the ink-jet head 300. The ink-jet head for comparison uses polycrystal PZT for the piezoelectric thin film and does not include the MAS intermediate film. The piezoelectric thin film of the ink-jet head for comparison was short-circuited and damaged with one third of the maximum voltage applied to the ink-jet head 300 of the second embodiment. Further, when the ink-jet head for comparison was driven by voltages reduced so as not to cause a short circuit, the ink-jet head for comparison jetted out only insufficient ink particles, thus resulting in poor print performance.

Figure 5:
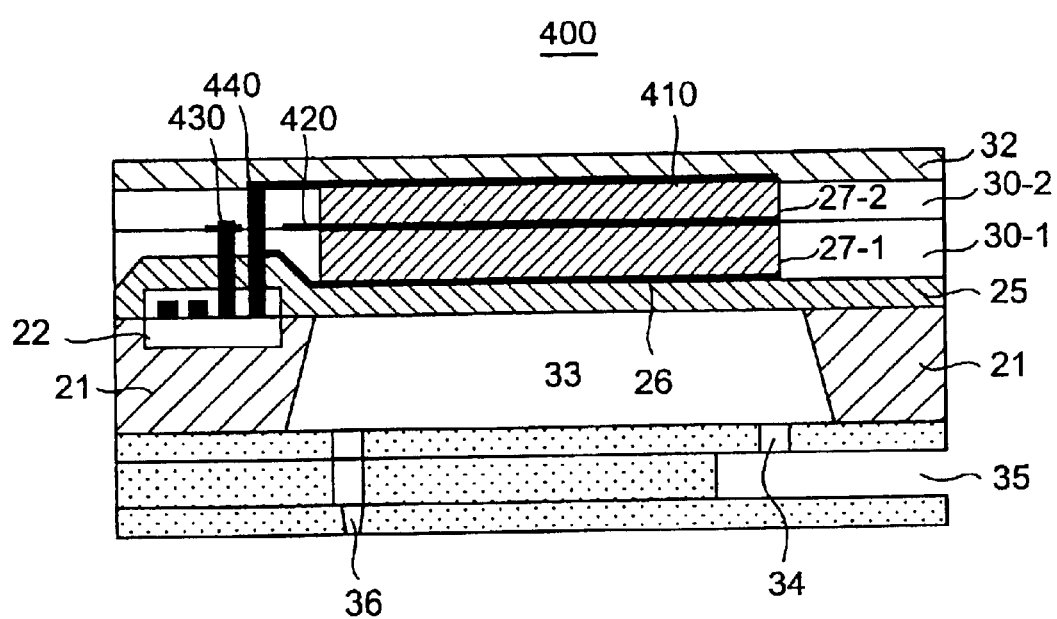
FIG. 5 is a diagram showing a variation of the ink-jet head of the first embodiment of the present invention, in which variation a bimorph single-crystal piezoelectric thin film formed of two layers is employed.

FIG. 5 is a diagram showing an ink-jet head 400, which is a variation of the ink-jet head 100 of the first embodiment. The single-crystal piezoelectric thin film 27 of the first embodiment is of a unimorph type with a single layer, while the ink-jet head 400 employs a single-crystal piezoelectric thin film of a bimorph type with two layers. By employing such a multilayer single-crystal piezoelectric thin film, the driving force applied to an ink pressure chamber can be increased.

In FIG. 5, the same elements as those of the ink-jet head 100 of the first embodiment are referred to by the same numerals. The ink-jet head 400 has its single-crystal piezoelectric thin film formed of the two layers of a lower thin film 27-1 and an upper thin film 27-2 with an intermediate electrode film 420 being formed therebetween. The ink-jet head 400 also includes two polyimide layers 30-1 and 30-2. The intermediate electrode film 420 serves as a common electrode to the lower and upper thin films 27-1 and 27-2. The lower electrode film 26 and an upper electrode film 410 are connected to an interconnection line 440 extending from the circuit 22, and the intermediate electrode film 420 is connected to an interconnection line 430 extending from the circuit 22.

The ink-jet head 400 can be manufactured by applying the process of manufacturing the ink-jet head 100 of the first embodiment. By adding the step of forming the intermediate electrode film 420 and the step of forming the polyimide layer 30-2, the ink-jet head 400 can be manufactured in the same way as the ink-jet head 100 of the first embodiment.

The above-described films from the lower electrode film 26 to the upper electrode film 410 are successively formed hetero-epitaxially on the YSZ intermediate layer 25, so that films contacting each other have a hetero-epitaxial relationship.

The single-crystal piezoelectric thin film of FIG. 5 is formed of the two layers 27-1 and 27-2, but a single-crystal thin film of more layers can be formed in the same way as in this variation. Further, the ink-jet head 300 of the second embodiment may be formed to include a single-crystal piezoelectric thin film formed of multiple layers.

As is apparent from the above detailed description, according to the present invention, a piezoelectric actuator having a single-crystal piezoelectric thin film can be manufactured at low cost by using a Si wafer widely used in the field of semiconductor manufacture. Such a piezoelectric actuator has high performance and high durability. An ink-jet head using such a piezoelectric actuator can be reduced in size and realize a printer of high image quality and low cost.

The present invention is not limited to the specifically disclosed embodiments, but variations and modifications may be made without departing from the scope of the present invention.

What is claimed is:

1. A piezoelectric actuator comprising:
    a single-crystal piezoelectric thin film having a crystal orientation thereof aligned with a crystal orientation of a single-crystal Si substrate; and
    first and second electrode films formed on first and second sides of said single-crystal piezoelectric thin film, respectively.

2. The piezoelectric actuator as claimed in claim 1, wherein at least one of said first and second electrode films is provided in contact with said single-crystal piezoelectric thin film in a hetero-epitaxial relationship therewith.

3. The piezoelectric actuator as claimed in claim 1, further comprising a diaphragm provided in contact with one of said first and second electrode films in a hetero-epitaxial relationship therewith, the one of said first and second electrode films being provided in contact with said single-crystal piezoelectric thin film in a hetero-epitaxial relationship therewith.

4. The piezoelectric actuator as claimed in claim 1, further comprising an intermediate layer growing hetero-epitaxially on the single-crystal Si substrate,
wherein said single-crystal piezoelectric thin film is grown hetero-epitaxially on said intermediate layer so as to have the crystal orientation aligned with that of the single-crystal Si substrate.

5. The piezoelectric actuator as claimed in claim 4, wherein said intermediate layer is formed as a diaphragm.

6. The piezoelectric actuator as claimed in claim 4, wherein said intermediate layer is formed of a material whose main component is selected from a group of $Y_2O_3$-added $ZrO_2$ (YSZ), $MgAlO_3$, $CeO$, $MgO$, and $Al_2O_3$.

7. The piezoelectric actuator as claimed in claim 6, wherein said single-crystal piezoelectric thin film is a lead-based perovskite oxide.

8. The piezoelectric actuator as claimed in claim 4, further comprising a semiconductor circuit for driving said single-crystal piezoelectric thin film, the semiconductor circuit being preformed on the single-crystal Si wafer.

9. The piezoelectric actuator as claimed in claim 4, wherein said single-crystal piezoelectric thin film is a lead-based perovskite oxide.

10. The piezoelectric actuator as claimed in claim 4, wherein one of said first and second electrode films serves as a diaphragm.

11. A piezoelectric actuator comprising:
a plurality of single-crystal piezoelectric thin films each having a crystal orientation thereof aligned with a crystal orientation of a single-crystal Si substrate; and
a plurality of electrode films,
wherein said single-crystal piezoelectric thin films and said electrode films are alternately layered one over another in contact with each other in a hetero-epitaxial relationship.

12. The piezoelectric actuator as claimed in claim 11, further comprising an intermediate layer growing hetero-epitaxially on the single-crystal Si substrate,
wherein each of said single-crystal piezoelectric thin films is grown hetero-epitaxially on said intermediate layer so as to have the crystal orientation aligned with that of the single-crystal Si substrate.

13. The piezoelectric actuator as claimed in claim 12, wherein said intermediate layer is formed as a diaphragm.

14. The piezoelectric actuator as claimed in claim 12, wherein said intermediate layer is formed of a material whose main component is selected from a group of $Y_2O_3$-added $ZrO_2$ (YSZ) $MgAlO_3$, $CeO$, $MgO$, and $Al_2O_3$.

15. The piezoelectric actuator as claimed in claim 14, wherein each of said single-crystal piezoelectric thin films is a lead-based perovskite oxide.

16. The piezoelectric actuator as claimed in claim 12, further comprising a semiconductor circuit for driving said single-crystal piezoelectric thin film, the semiconductor circuit being preformed on the single-crystal Si wafer.

17. The piezoelectric actuator as claimed in claim 12, wherein each of said single-crystal piezoelectric thin films is a lead-based perovskite oxide.

18. The piezoelectric actuator as claimed in claim 12, wherein one of said electrode films serves as a diaphragm.

19. An ink-jet head comprising:
a piezoelectric actuator,
the piezoelectric actuator comprising:
a single-crystal piezoelectric thin film having a crystal orientation thereof aligned with a crystal orientation of a single-crystal Si substrate; and
first and second electrode films formed on first and second sides of said single-crystal piezoelectric thin film, respectively.

20. The ink-jet head as claimed in claim 19, wherein said piezoelectric actuator has at least one of said first and second electrode films provided in contact with said single-crystal piezoelectric thin film in a hetero-epitaxial relationship therewith.

21. The ink-jet head as claimed in claim 19, wherein said piezoelectric actuator further comprises a diaphragm provided in contact with one of said first and second electrode films in a hetero-epitaxial relationship therewith, the one of said first and second electrode films being provided in contact with said single-crystal piezoelectric thin film in a hetero-epitaxial relationship therewith.

22. The ink-jet head as claimed in claim 19, wherein said piezoelectric actuator further comprises an intermediate layer growing hetero-epitaxially on the single-crystal Si substrate; and
said single-crystal piezoelectric thin film is grown hetero-epitaxially on said intermediate layer so as to have the crystal orientation aligned with that of the single-crystal Si substrate.

23. The ink-jet head as claimed in claim 22, wherein said intermediate layer is formed as a diaphragm.

24. The ink-jet head as claimed in claim 22, wherein said intermediate layer is formed of a material whose main component is selected from a group of $Y_2O_3$-added $ZrO_2$ (YSZ) $MgAlO_3$, $CeO$, $MgO$, and $Al_2O_3$.

25. The ink-jet head as claimed in claim 24, wherein said single-crystal piezoelectric thin film is a lead-based perovskite oxide.

26. The ink-jet head as claimed in claim 22, wherein said piezoelectric actuator further comprises a semiconductor circuit for driving said single-crystal piezoelectric thin film, the semiconductor circuit being preformed on the single-crystal Si wafer.

27. The ink-jet head as claimed in claim 22, wherein said single-crystal piezoelectric thin film is a lead-based perovskite oxide.

28. The ink-jet head as claimed in claim 22, wherein one of said first and second electrode films serves as a diaphragm.

29. An ink-jet head comprising:
a piezoelectric actuator,
the piezoelectric actuator comprising:
a plurality of single-crystal piezoelectric thin films each having a crystal orientation thereof aligned with a crystal orientation of a single-crystal Si substrate; and
a plurality of electrode films,
wherein said single-crystal piezoelectric thin films and said electrode films are alternately layered one over another in contact with each other in a hetero-epitaxial relationship.

30. The ink-jet head as claimed in claim 29, wherein said piezoelectric actuator further comprises an intermediate layer growing hetero-epitaxially on the single-crystal Si substrate; and each of said single-crystal piezoelectric thin films is grown hetero-epitaxially on said intermediate layer so as to have the crystal orientation aligned with that of the single-crystal Si substrate.

31. The ink-jet head as claimed in claim 30, wherein said intermediate layer is formed as a diaphragm.

32. The ink-jet head as claimed in claim 30, wherein said intermediate layer is formed of a material whose main component is selected from a group of $Y_2O_3$-added $ZrO_2$ (YSZ), $MgAlO_3$, CeO, MgO, and $Al_2O_3$.

33. The ink-jet head as claimed in claim 32, wherein each of said single-crystal piezoelectric thin films is a lead-based perovskite oxide.

34. The ink-jet head as claimed in claim 30, wherein said piezoelectric actuator further comprises a semiconductor circuit for driving said single-crystal piezoelectric thin film, the semiconductor circuit being preformed on the single-crystal Si wafer.

35. The ink-jet head as claimed in claim 30, wherein each of said single-crystal piezoelectric thin films is a lead-based perovskite oxide.

36. The ink-jet head as claimed in claim 30, wherein one of said electrode films serves as a diaphragm.

37. An ink-jet printer comprising:

an ink-jet head, the ink-jet head comprising:

a piezoelectric actuator, the piezoelectric actuator comprising:

a single-crystal piezoelectric thin film having a crystal orientation thereof aligned with a crystal orientation of a single-crystal Si substrate; and first and second electrode films formed on first and second sides of said single-crystal piezoelectric thin film, respectively.

38. The ink-jet printer as claimed in claim 37, wherein said piezoelectric actuator has at least one of said first and second electrode films provided in contact with said single-crystal piezoelectric thin film in a hetero-epitaxial relationship therewith.

39. The ink-jet printer as claimed in claim 37, wherein said piezoelectric actuator further comprises a diaphragm provided in contact with one of said first and second electrode films in a hetero-epitaxial relationship therewith, the one of said first and second electrode films being provided in contact with said single-crystal piezoelectric thin film in a hetero-epitaxial relationship therewith.

40. The ink-jet printer as claimed in claim 37, wherein said piezoelectric actuator further comprises an intermediate layer growing hetero-epitaxially on the single-crystal Si substrate; and said single-crystal piezoelectric thin film is grown hetero-epitaxially on said intermediate layer so as to have the crystal orientation aligned with that of the single-crystal Si substrate.

41. The ink-jet printer as claimed in claim 40, wherein said intermediate layer is formed as a diaphragm.

42. The ink-jet printer as claimed in claim 40, wherein said intermediate layer is formed of a material whose main component is selected from a group of $Y_2O_3$-added $ZrO_2$ (YSZ), $MgAlO_3$, CeO, MgO, and $Al_2O_3$.

43. The ink-jet printer as claimed in claim 42, wherein said single-crystal piezoelectric thin film is a lead-based perovskite oxide.

44. The ink-jet printer as claimed in claim 40, wherein said piezoelectric actuator further comprises a semiconductor circuit for driving said single-crystal piezoelectric thin film, the semiconductor circuit being preformed on the single-crystal Si wafer.

45. The ink-jet printer as claimed in claim 40, wherein said single-crystal piezoelectric thin film is a lead-based perovskite oxide.

46. The ink-jet printer as claimed in claim 40, wherein one of said first and second electrode films serves as a diaphragm.

47. An ink-jet printer comprising:

an ink-jet head, the ink-jet head comprising:

a piezoelectric actuator, the piezoelectric actuator comprising:

a plurality of single-crystal piezoelectric thin films each having a crystal orientation thereof aligned with a crystal orientation of a single-crystal Si substrate; and a plurality of electrode films, wherein said single-crystal piezoelectric thin films and said electrode films are alternately layered one over another in contact with each other in a hetero-epitaxial relationship.

48. The ink-jet printer as claimed in claim 47, wherein said piezoelectric actuator further comprises an intermediate layer growing hetero-epitaxially on the single-crystal Si substrate; and each of said single-crystal piezoelectric thin films is grown hetero-epitaxially on said intermediate layer so as to have the crystal orientation aligned with that of the single-crystal Si substrate.

49. The ink-jet printer as claimed in claim 48, wherein said intermediate layer is formed as a diaphragm.

50. The ink-jet printer as claimed in claim 48, wherein said intermediate layer is formed of a material whose main component is selected from a group of $Y_2O_3$-added $ZrO_2$ (YSZ), $MgAlO_3$, CeO, MgO, and $Al_2O_3$.

51. The ink-jet printer as claimed in claim 50, wherein each of said single-crystal piezoelectric thin films is a lead-based perovskite oxide.

52. The ink-jet printer as claimed in claim 48, wherein said piezoelectric actuator further comprises a semiconductor circuit for driving said single-crystal piezoelectric thin film, the semiconductor circuit being preformed on the single-crystal Si wafer.

53. The ink-jet printer as claimed in claim 48, wherein each of said single-crystal piezoelectric thin films is a lead-based perovskite oxide.

54. The ink-jet printer as claimed in claim 48, wherein one of said electrode films serves as a diaphragm.

\* \* \* \* \*